United States Patent
Shah et al.

(10) Patent No.: US 10,289,773 B2
(45) Date of Patent: May 14, 2019

(54) RESET DOMAIN CROSSING MANAGEMENT USING UNIFIED POWER FORMAT

(71) Applicant: Synopsys, Inc., Mountain View, CA (US)

(72) Inventors: Deep Shah, San Jose, CA (US); Namit Gupta, San Jose, CA (US); Mohamed Shaker Sarwary, San Diego, CA (US)

(73) Assignee: Synopsys, Inc., Mountain View, CA (US)

( * ) Notice: Subject to any disclaimer, the term of this patent is extended or adjusted under 35 U.S.C. 154(b) by 109 days.

(21) Appl. No.: 15/633,542

(22) Filed: Jun. 26, 2017

(65) Prior Publication Data

US 2018/0004876 A1   Jan. 4, 2018

Related U.S. Application Data

(60) Provisional application No. 62/357,296, filed on Jun. 30, 2016.

(51) Int. Cl.
  *G06F 17/50*  (2006.01)
(52) U.S. Cl.
  CPC ........ *G06F 17/5022* (2013.01); *G06F 17/505* (2013.01); *G06F 2217/62* (2013.01)
(58) Field of Classification Search
  CPC . G06F 17/5022; G06F 17/505; G06F 2217/62
  USPC .......... 716/106, 109, 127, 133, 136; 703/15
  See application file for complete search history.

(56) References Cited

U.S. PATENT DOCUMENTS

| | | | |
|---|---|---|---|
| 7,349,835 B2 * | 3/2008 | Kapoor | G06F 17/5045 703/18 |
| 8,683,419 B1 * | 3/2014 | Hines | G06F 17/505 716/109 |
| 2016/0063161 A1 * | 3/2016 | Kwok | G01R 31/00 716/106 |
| 2017/0060205 A1 * | 3/2017 | Bharath | H02M 3/1584 |
| 2017/0147720 A1 * | 5/2017 | Hsu | G06F 17/5022 |

* cited by examiner

*Primary Examiner* — Phallaka Kik
(74) *Attorney, Agent, or Firm* — Bever, Hoffman & Harms, LLP

(57) ABSTRACT

Information from a circuit design's unified power format (UPF) description is utilized to automate the management of reset domain crossings (RDCs). The UPF description is utilized to identify signals that generate both RDC and power domain crossings (PDCs), thereby allowing a circuit designer to efficiently utilize a common (shared) isolation circuit that functions to manage both the RDC (i.e., during reset functions) and the PDC (i.e., during power management functions). A modified UPF description is introduced that facilitates automated management of RDC issues by treating the reset domains as pseudo-power domains, and utilizing UPF analysis and verification tools to automatically generate both shared and non-shared resources for both RDC and PDC issues.

20 Claims, 12 Drawing Sheets

RESET DOMAIN CROSSING MANAGEMENT USING UNIFIED POWER FORMAT

RELATED APPLICATION

This application claims priority from U.S. Provisional Patent Application 62/357,296, entitled "UPF AWARE RESET DOMAIN CROSSING", which was filed on Jun. 30, 2016, and is incorporated by reference herein.

BACKGROUND

Metastability occurs when digital signals passed between circuit elements (e.g., from one flip-flop to a second flip flop) are unable to settle into a stable '0' or '1' logic level within the time required for proper circuit operation, thereby resulting in erroneous data transfers. A well-known source of metastability occurs when signals are passed from a first circuit element controlled by one clock signal to a second circuit element controlled by a second clock signal. Clock domain crossings (CDCs) and power domain crossings (PDCs) are well-known sources of metastability. Asynchronous reset crossings within a same clock domain can also cause metastability. Use of asynchronous resets is becoming more prevalent because of the wider use of multiphase power-up boot sequences. As a consequence, Reset Domain Crossing (RDC) issues are causing more and more design errors. Such errors can add significant time and expense to the design and debug cycles, and may even find their way into the silicon, necessitating costly re-spins. Like CDC verification, RDC verification is equally important to ensure that the designs work as expected.

In modern integrated circuits (ICs), there may exist domains (sub-circuits) where the power can be independently controlled (power domains), and also domains that can be independently reset (reset domains). Problems arise when signals cross from one domain to another. This is referred to as a domain crossing. Each type of crossing (power and reset) must be checked to ensure that domain crossings do not lead to circuit instability.

One technique for addressing signal domain crossing is to gate the crossing between domains and to open the gate only when it is safe for data signals to cross the domains. Referring to FIG. 1(A), if a first reset signal 58 is asserted to a source flop 52 in a first reset domain (first reset signal 60), then the source flop data output 64 of source flop 52 is asynchronous to the clock 55. If second reset signal 58 is not asserted (not active) to flop 54 in a second reset domain (with second reset signal 59), a destination flop data output of destination flop 54 in a second reset domain can become metastable due to a data setup/hold violation caused by the asynchronous assertion of the first reset signal 58 in the first reset domain.

FIG. 1(B) illustrates one technique to make a safe data path between the two reset domains. A second flop 64 is inserted immediately after the data path between the source flop 52 and the destination flop 54. At reset signal 59 assertion, output 68 of destination flop 64 can still go metastable but second flop 54 adds one extra clock cycle delay to path. Metastable value of a signal tends to settle down eventually to known value with time. Metastable value of signal 68 of flop 64 may settle down because of extra clock delay of second flop 54. Thus containing unstable (metastable) behavior of circuit.

FIG. 1(C) illustrates yet another technique to make a safe data path between reset domains. The source flop data output 52 (data of reset domain with reset signal 58) is passed through a gate 72 before reaching the data input of destination flop 54 (another reset domain with reset signal 59), again ensuring that the destination flop data input 76 is a stable value regardless of when the first reset signal 58 asserts. The gate 72 may be operated by an isolation flop 76 that outputs a gate control 78 signal to the gate 72.

FIG. 1(D) illustrates a circuit 80 comprising a first power domain 82 and a second power domain 84. A first power domain output 88 is gated by a gate 86 under the control of a gate enable 85. This controls the gate output 87 to the second power domain 84, providing a safe path between the power domains.

The various gating circuits for creating safe data paths between domains described in FIG. 1(D) may collectively be referred to as "isolation strategies". And signal 85 in FIG. 4 is called UPF isolation enable signal, UPF isolation control signal, or power domain control signal.

Conventionally, when both reset domain and power domain crossings are present together on same design path in an IC design, the designer analyzes them separately and applies control gates separately. That is, modern IC designs are typically defined using both a Hardware Description Language (HDL) description and a Unified Power Format (UPF) description, and modern EDA software tools include both HDL design and verification tools that are configured to identify and addressing RDC issues using the HDL description, and separate UPF tools configured to identify and addressing PDC issues using the UPF description. Because design must use separate design and verification tools to address RDC and PDC issues, the designer often generates isolation and synchronization circuitry to address RDC issues that is different from isolation circuitry generated to address PDC issues, even when some of the circuitry could be efficiently "shared" (i.e., utilized to address both RDC issues and related PDC issues). The generation of separate circuitry thus generates an unnecessarily high design burden on the designer, and can lead to unnecessarily larger circuit designs and signal delays due, for example, to redundant isolation gates.

What is needed is a methodology and associated design and verification tools that avoids the issues set forth above. In particular, what is needed is an efficient method for providing isolation/synchronization circuitry in a circuit design that automatically detects and either notifies a designer when isolation resources may be shared by related reset domain crossings (RDCs) and power domain crossings (PDCs), or automatically generates a shared RDC/PDC isolation solution.

BRIEF SUMMARY

The present invention greatly simplifies the management of reset domain crossings (RDCs) in a circuit design by way of utilizing one or more functions conventionally performed by Unified Power Format (UPF) software tools to automatically identify RDCs that can be addressed using isolation resources that are "shared" with corresponding power domain crossings (PDCs). Similar to conventional approaches, each circuit design processed by the enhanced EDA software tool is defined using both an HDL description that is written using an established HDL format (e.g., VHDL, Verilog or System Verilog) and a UPF description that is written using an established UPF format (e.g., IEEE Standard 1801-2009), and the enhanced EDA software tool implements analysis and verification methodologies that process the HDL and UPF descriptions in a manner similar to the approach utilized by conventional EDA software tools. The enhanced EDA design tools differs from conventional EDA software tools by way of introducing a novel technique for performing RDC management that utilizes the UPF description to identify instances where an RDC isolation solution may be co-generated with an associated PDC isolation solution, thereby reducing design burdens on circuit designers by eliminating redundant isolation gates, and improving circuit performance by eliminating signal delays generated by redundant isolation gates.

According to an embodiment of the present invention, both an initial HDL description and an initial UPF description of a circuit design are utilized to automatically identify each signal of the circuit design that forms both an RDC (i.e., as identified by way of the initial HDL description) and a PDC (i.e., as identified in the UPF description), and then a report is generated that notifies a circuit designer of all such signals so that potentially redundant isolation gates are avoided. In one embodiment, the initial HDL description for the initial circuit design is utilized to identify all RDCs that have not yet been resolved (i.e., all RDCs that have not yet been assigned isolation or synchronization solutions in the initial HDL description), and then the UPF description is analyzed to determine if each unresolved RDC signal identified in the initial HDL description also forms an associated PDC (i.e., the same signal is both identified as an RDC in the HDL description and as a PDC in the UPF description). Each signal that forms both an RDC and a PDC is flagged as a candidate for shared RDC/PDC isolation (i.e., the circuit designer is notified that a single isolation gate may be efficiently utilized to provide both reset domain and power domain isolation functions, which reduces design time and delays by avoiding the generation of unnecessary redundant isolation gates). In addition, all RDC signals that have not yet been addressed using isolation or synchronization circuitry, and do not have associated PDC functions, are flagged as problematic signals that must also be addressed before verification. Once all of the RDC signals have been processed, a report is generated and/or transmitted to the circuit designer indicating all RDC signals that may be addressed using shared isolation circuits and/or problematic signals that require concerted attention, thereby providing the circuit designer with an automatically generated comprehensive list of all unresolved RDC issues. Accordingly, in addition to automatically generating a comprehensive list of unresolved RDC issues, the present invention reduces design burdens by allowing circuit designers to efficiently utilize, wherever possible, "shared" isolation strategies (e.g., AND logic gates) that can be cooperatively controlled to perform both power control and reset control isolation functions, thereby minimizing the final circuit design size and signal delays by way of eliminating redundant RDC/PDC isolation gates.

In another embodiment, the present invention proposes the use of a modified UPF description in which reset domains identified in the initial HDL description are modeled as pseudo-power domains in the modified UPF descriptions, thereby facilitating the automated generation of RDC isolation resources and shared RDC/PDC isolation solutions using techniques similar to those currently used by UPF tools to provide PDC isolation solutions.

Also described herein are specific embodiments of processes and systems utilized when both power and reset domain crossings are present in a circuit design, and function to automatically modify the circuit design as needed to provide efficient (shared) isolation circuits that ensure stability for both power and reset domain crossings in an integrated circuit subsequently fabricated using the circuit design. In one embodiment of the invention, the power domain crossing information is utilized to verify and efficiently modify (if needed) the RDCs such that all RDCs are provided with safe data paths using power domain isolation resources (i.e., isolation gates/controls). Specifically, the present invention recognizes that, when power and reset domain crossings overlap, both the power domain crossing and the overlapping reset domain crossing may be made safe using a shared isolation circuit (cell) and/or gate. According to this embodiment, related information from the UPF description is applied to RDC analysis to identify where RDC and power domain boundaries overlap. If a common isolation circuit can be formed to make both crossings safe, the common circuit is applied to the RDC analysis in order to reduce noise (i.e., by way of eliminating a redundant second isolation circuit). If a common isolation circuit is not present, a new circuit is optionally generated in the modified UPF to resolve the unsafe RDC. Accordingly, the circuit design is automatically modified to include a new or revised UPF description including all isolation strategies needed to ensure stable RDC operations in the subsequently fabricated IC. Consequently, the present invention reduces verification efforts by way of coordinating UPF and RDC verification processes, and facilitates the efficient production of improved ICs by automatically modifying the UPF circuit design to include shared isolation cells that also remove unsafe RDCs, which reduces noise.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

"RDC" in this context refers to Reset Domain Crossing, an asynchronous reset crossing within a same clock domain or different clock domain.

"UPF" in this context refers to Unified Power Format. UPF is described in IEEE Standard 1801-2009, based on Accellera's Unified Power Format (UPF), and allows designers to describe low power designs and improve the way complex integrated circuits are designed, verified and implemented. UPF covers the Register Transfer Level (RTL) up through more detailed levels of implementation and verification.

Figure 1A:
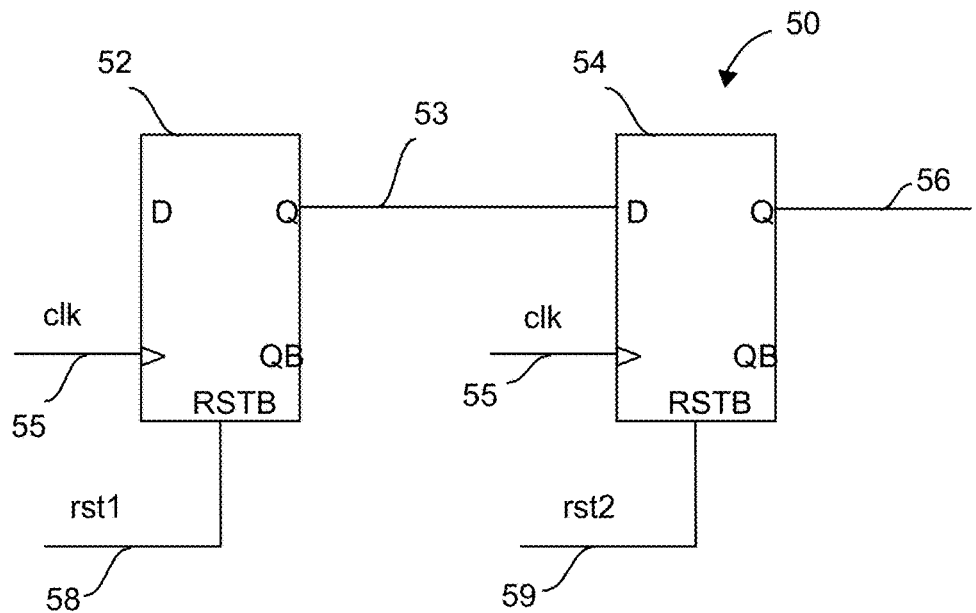
FIG. 1(A) illustrates an embodiment of a circuit comprising multiple reset domains.
Figure 1B:
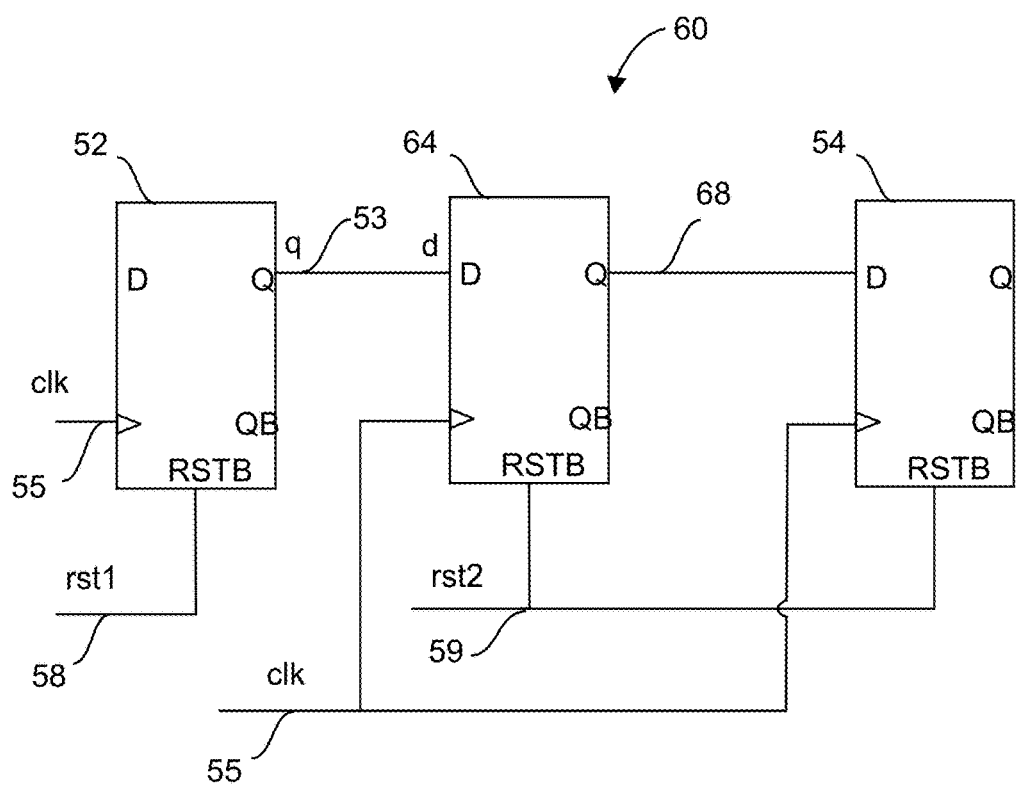
FIG. 1(B) illustrates an embodiment of circuit comprising multiple reset domains and a safe data path between the reset domains.
Figure 1C:
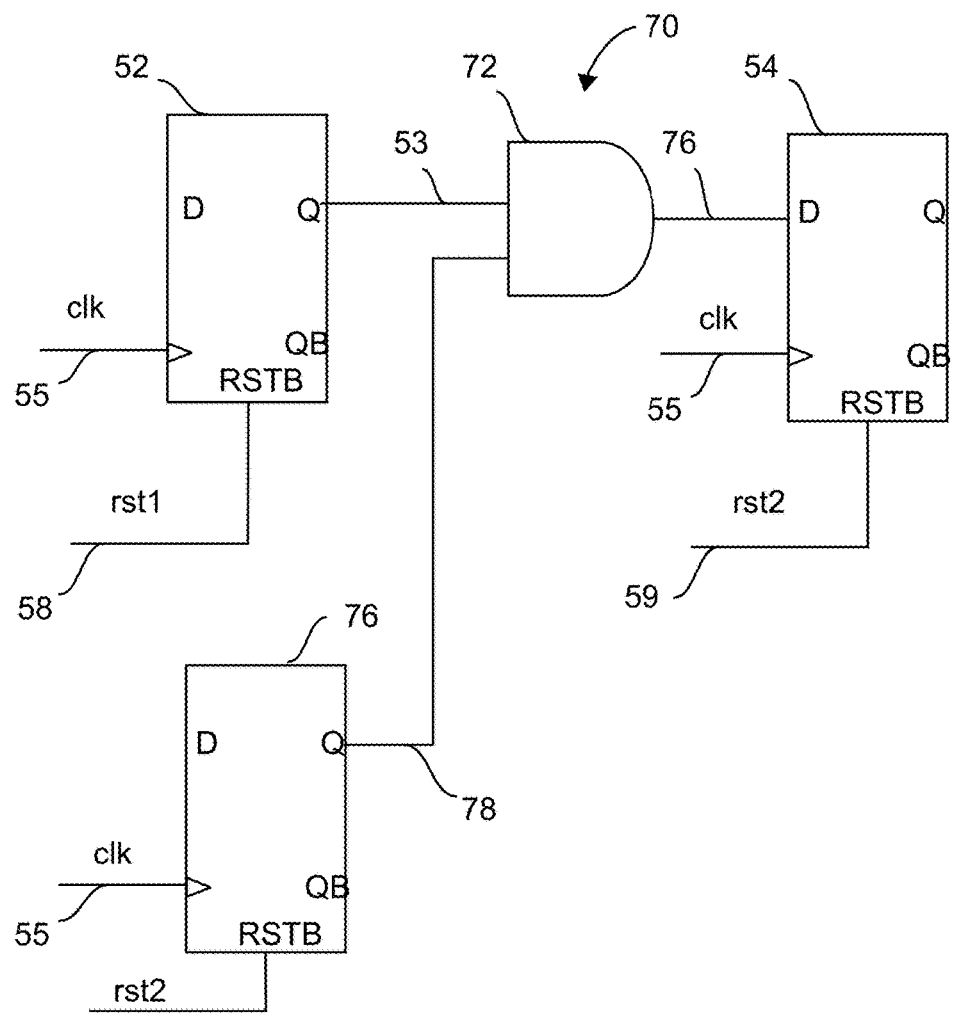
FIG. 1(C) illustrates an embodiment of a circuit comprising multiple reset domains and a safe data path between the reset domains.
Figure 1D:
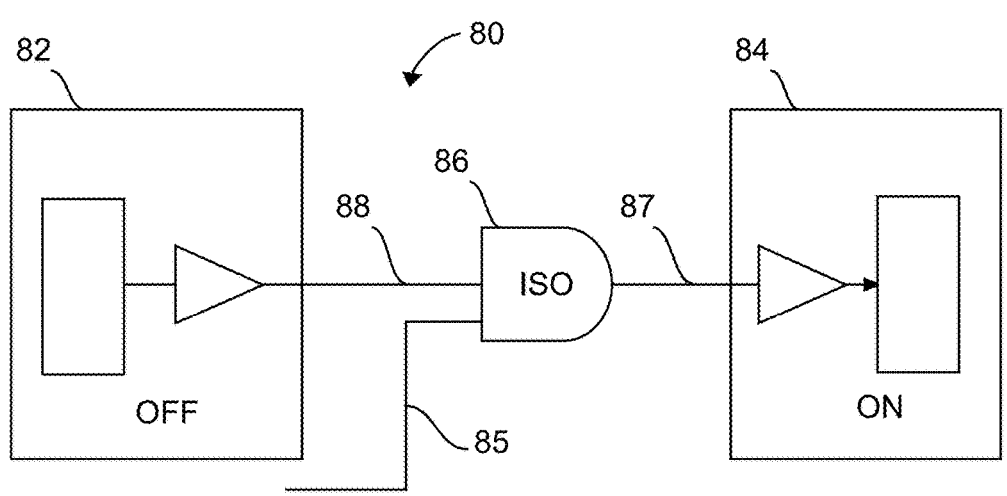
FIG. 1(D) illustrates an embodiment of circuit comprising multiple power domains and a safe data path between the power domains.
Figure 2:
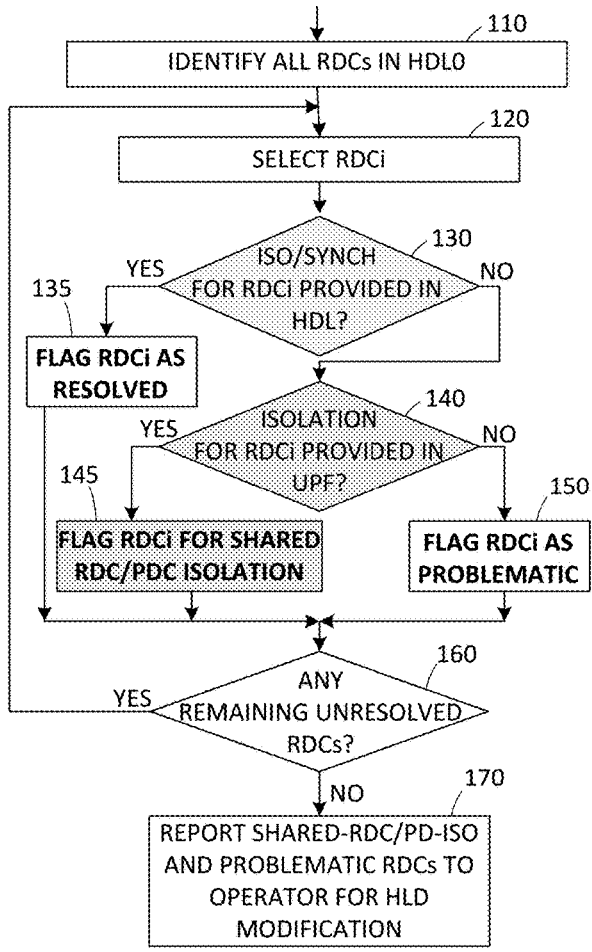
FIG. 2 is a flow diagram depicting a circuit modification process according to an exemplary embodiment of the present invention.

FIG. 2 illustrates an efficient methodology for addressing RDCs and PDCs in an initial circuit design according to an exemplary embodiment of the present invention. In general, blocks 110 to 160 of FIG. 2 depict a loop during which both an initial HDL description and an initial UPF description of a circuit design are utilized to automatically identify each signal of the initial circuit design that forms both an RDC in the HDL description and a PDC in the UPF description, and to also optionally identify all signals associated with unresolved RDCs. Block 110 includes identifying all signals that form corresponding RDCs in a circuit design's HDL description. Block 120 forms the top of the process loop during which one of the RDC signals (i.e., "RDCi") is selected for analysis. Block 130 includes an optional step of verifying that RDCi has not already been previously assigned isolation or synchronization resources (i.e., in some instances reset domain resources may already be provided with a unit cell, and for various reasons a circuit designer may opt not to change these previously assigned resources). If RDCi includes previously assigned resources (i.e., the "YES" branch from block 130), then control is passed to block 135 in which RDCi is flagged as "resolved" or otherwise identified as not requiring additional attention by the circuit designer, thereby reducing the design burden by separating these resolved signals from the signals mentioned below that require additional attention. If RDCi does not include previously assigned resources (i.e., the "NO" branch from block 130), then control is passed to block 140. Block 140 includes the novel process of accessing the UPF description to determine if the signal associated with RDCi is also associated with a PDC (i.e., the signal both extends between two reset domains in the HDL description and also extends between to power domains in the UPF description). If the signal associated with RDCi is also associated with a corresponding PDC (i.e., the "YES" branch from block 140), then control is passed to block 145 in which RDCi is flagged as a candidate for shared RDC/PDC isolation resources, thereby avoiding the inadvertent generation of redundant isolation resources in the manner described herein. If the signal associated with RDCi does not form a corresponding PDC (i.e., the "NO" branch from block 140), then control is passed to block 150. Each RDCi that is passed to block 150 is flagged as being "problematic", which indicates to the circuit designer that dedicated isolation or synchronization resources must be generated for this RDC/signal. Block 160 redirects control of the process back to block 120 for selection of a next RDCi until all RDCs in the circuit design have been processed, and then control passes to block 170. Block 170 (see bottom of FIG. 2) involves the subsequent generation of a report listing at least the candidate RDCs/signals ("shared-RDC/PDC-iso" RDCs) that are identified in block 145, and all problematic RDCs identified in block 150. As set forth herein, this report is then provided to a circuit designer for use in the modification of the initial circuit design to address all shared-RDC/PDC-iso RDCs and all problematic RDCs. With this approach, the circuit design is empowered to efficiently determine each instance where a single isolation gate may be utilized to perform both RDC and PDC operations, thereby avoiding undesirable redundant isolation gates that increase overall circuit size and generate undesirable signal delays. This approach also allows the circuit designer to confidently address only those RDCs that require his attention without worry that unresolved RDC issues will be discovered during subsequent analysis and verification processing prior to the production of an IC chip based on the final circuit design. The present invention thus reduces both processing time and design burden, which reduces overall production costs.

Figure 4:
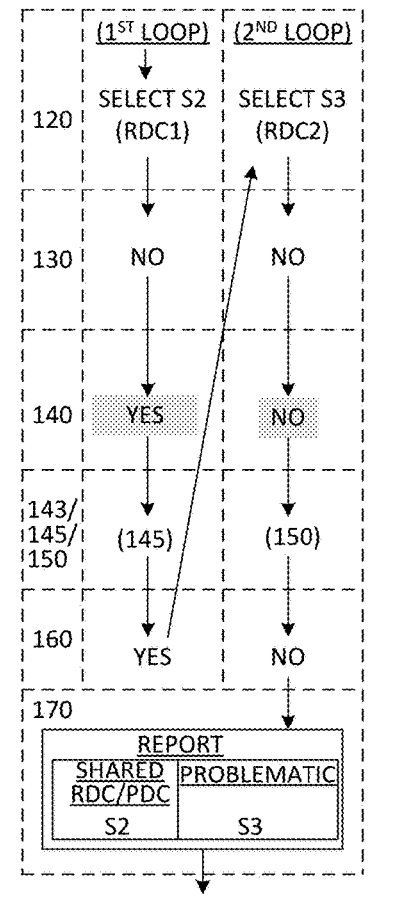
FIG. 4 is a flow diagram depicting an exemplary execution of the process.
Figure 3:
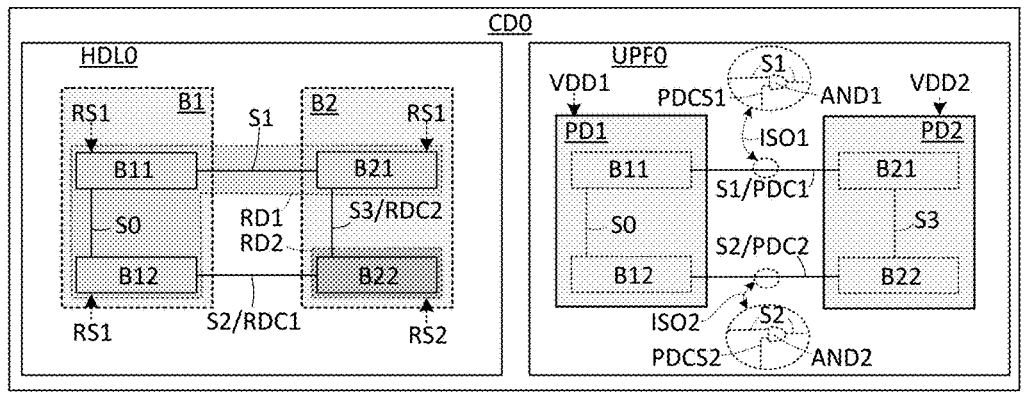
FIG. 3 is a diagram depicting an exemplary simplified circuit design.

FIG. 3 illustrates a simplified initial circuit description CD0 and FIG. 4 is flow diagram depicting exemplary processing of circuit description CD0 using the methodology of FIG. 2. For descriptive purposes, initial circuit design CD0 is indicated as being defined by an initial HDL description HDL0 and an initial UPF description UPF0, which in practice are generated using known techniques. Those skilled in the art will recognize that circuit design CD0 is greatly simplified for descriptive purposes, and that the specific details indicated in initial HDL description HDL0 and initial UPF description UPF0 does not necessarily correlate with information provided in actual HDL and UPF descriptions.

Referring to HDL description HDL0 (see the left side of FIG. 3), circuit design CD0 generally includes two circuit blocks B1 and B2 that may represent unit (standard) cells, with block B1 including circuit structures B11 and B12, and block B2 including circuit structures B21 and B22. These circuit structures are connected by way of signals S0 to S3, with signal S0 passing between structures B11 and B12, signal S1 passing between structures B11 and B12, signal S2 passing between structures B12 and B22, and signal S3 passing between structures B21 and B22. HDL description HDL0 also indicates that circuit structures B11 to B22 are generally grouped into two reset domains RD1 and RD2 by way of being controlled by reset signals RS1 and RS2. That is, circuit structures B11, B12 and B22 are controlled by reset signal RS1, and are therefore grouped in reset domain RD1. In contrast, circuit structure B22 is controlled by reset signal RS2, and is therefore disposed in reset domain RD2. For purposes of discussion, it is assumed that reset signals RS1 and RS2 are not compatible. With this configuration, signals S0 and S1 do not form RDCs because these signals pass between circuit structures within reset domain RD1. However, signals S2 and S3 pass between reset domain RD1 and RD2, and therefore form corresponding RDCs (i.e., signal S2 forms a first RDC referred to as RDC1, and signal S3 forms a second RDC referred to as RDC2).

Referring to UPF description UPF0 (right side of FIG. 3), circuit structures B11 to B22 of circuit design CD0 are generally grouped into two power domains PD1 and PD2 by way of being powered using supply voltages VDD1 and VDD2. With this configuration, signals S0 and S3 do not form PDCs because these signals pass between circuit structures within power domains PD1 and PD2, respectively (i.e., signal S0 passes between structures B11 and B12 within power domain PD1, and signal S3 passes between structures B21 and B22 within power domain PD2). However, signals S1 and S2 pass between power domains PD1 and PD2, and therefore form corresponding PDCs (i.e., signal S1 forms a first PDC referred to as PDC1, and signal S2 forms a second PDC referred to as PDC2). In some instances UPF description UPF0 includes optional isolation resources that are automatically assigned to each PDC—such optional isolation resources are indicated in FIG. 3 as resource ISO1 including logic-AND gate AND1 that is controlled by power domain control signal PDCS1 to isolate signal S1 passing between circuit structures B11 and B21, and resource ISO2 including logic-AND gate AND2 that is controlled by power domain control signal PDCS2 to isolate signal S2 passing between circuit structures B21 and B22.

Referring to FIG. 4, processing of initial circuit description CD0 may proceed as follows. Starting at the top of the left column in FIG. 4, a first loop iteration includes selecting one of the two RDCs identified by way of HDL description HDL0 (e.g., signal S2, with forms RDC1). For purposes of this example, the check for previously-assigned isolation or synchronization resources (block 130 in FIG. 2) generates a "NO" result. However, the subsequent check for a corresponding PDC (block 140 in FIG. 2) generates a "YES" result because signal S2 is associated with power domain crossing PDC2 in UPF description UPF0, whereby signal S2 (RDC1) is flagged as a candidate for shared RDC/PDC isolation resources (block 145 of FIG. 2). Because at least one RDC remains unresolved (i.e., signal S3, RDC2), the process is then repeated (i.e., the "YES" branch from block 160 in FIG. 2 is followed, and signal S3/RDC2 is selected in block 120). The check for previously-assigned isolation or synchronization resources (block 130 in FIG. 2) again generates a "NO" result, and this time the subsequent check for a corresponding PDC (block 140 in FIG. 2) also generates a "NO" result because signal S3 is transmitted within power domain PD2 (i.e., signal S3 is not associated with a PDC in UPF description UPF0). Accordingly, signal S3 (RDC2) is flagged as a problematic RDC (block 150 of FIG. 2). Because all RDCs have been resolved (block 160 in FIG. 2), a report is then generated that indicates signal S2 as being a shared RDC/PDC isolation resource candidate, and indicating signal S3 as being problematic (i.e., requiring dedicated isolation or synchronization resources). The report is transmitted or otherwise presented for use by the circuit designer in modifying initial circuit design CD0 to either utilize shared resources for signal S2 (if the circuit designer determines shared isolation is possible) and generate dedicated resources for signal S3, or to generate dedicated resources for both signals S2 and S3 (i.e., when the circuit designer determines that shared isolation resources are not feasible). In one example, when the signal designer determines that isolation structure ISO2 (FIG. 2) may be utilized (shared) by signal S2, the circuit designer modifies the description of control signal PDCS2 to include the additional control signals associated with reset domain control functions, whereby appropriately modified control circuitry is generated later in the design process using known techniques.

Figure 5:
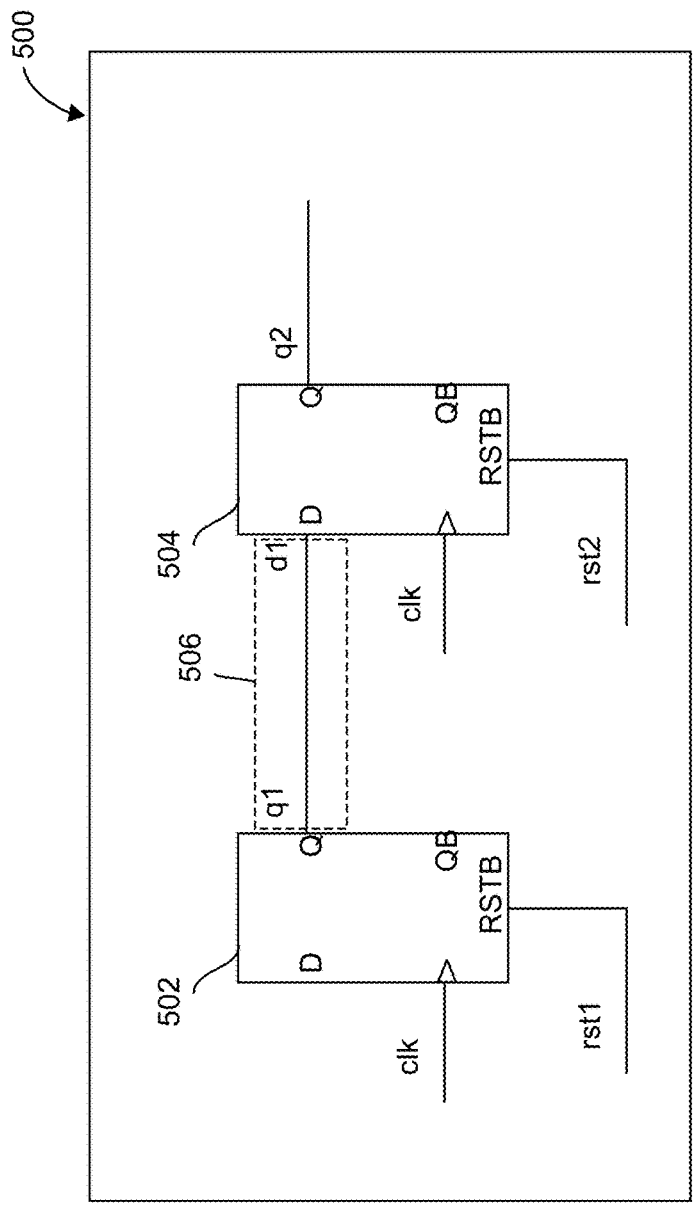
FIG. 5 illustrates an embodiment of a circuit having multiple reset domains.
Figure 6:
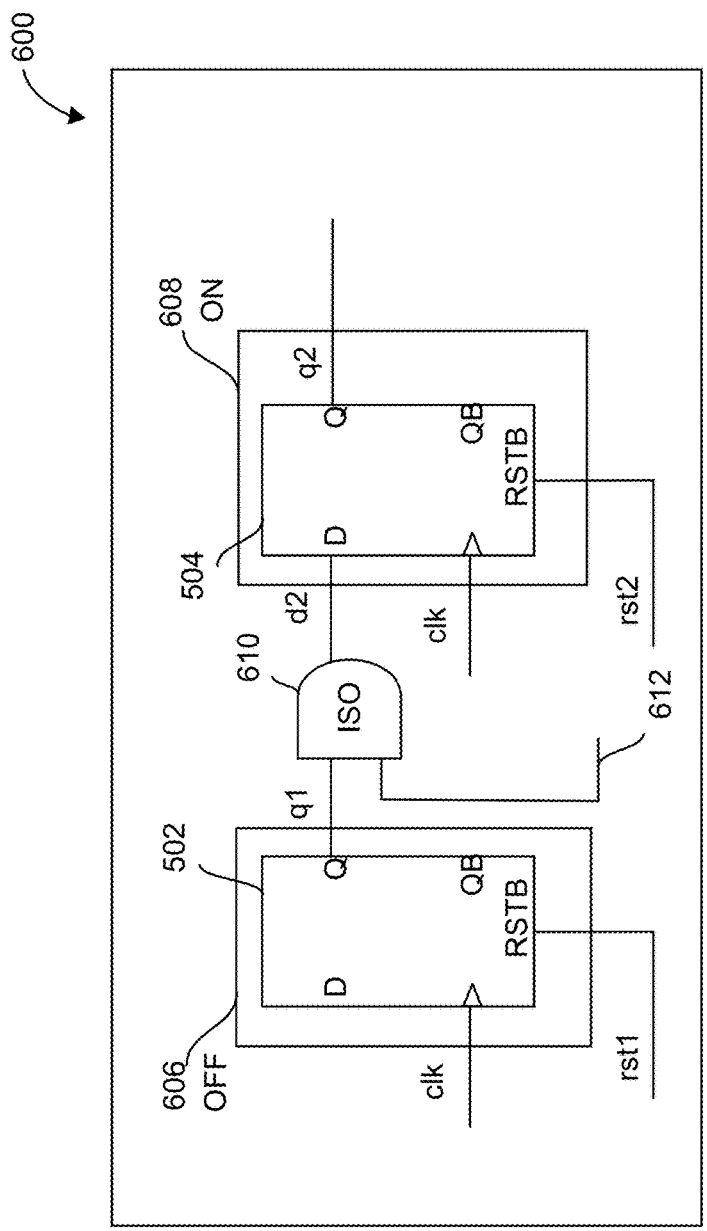
FIG. 6 illustrates an embodiment of a modified circuit design.
Figure 7:
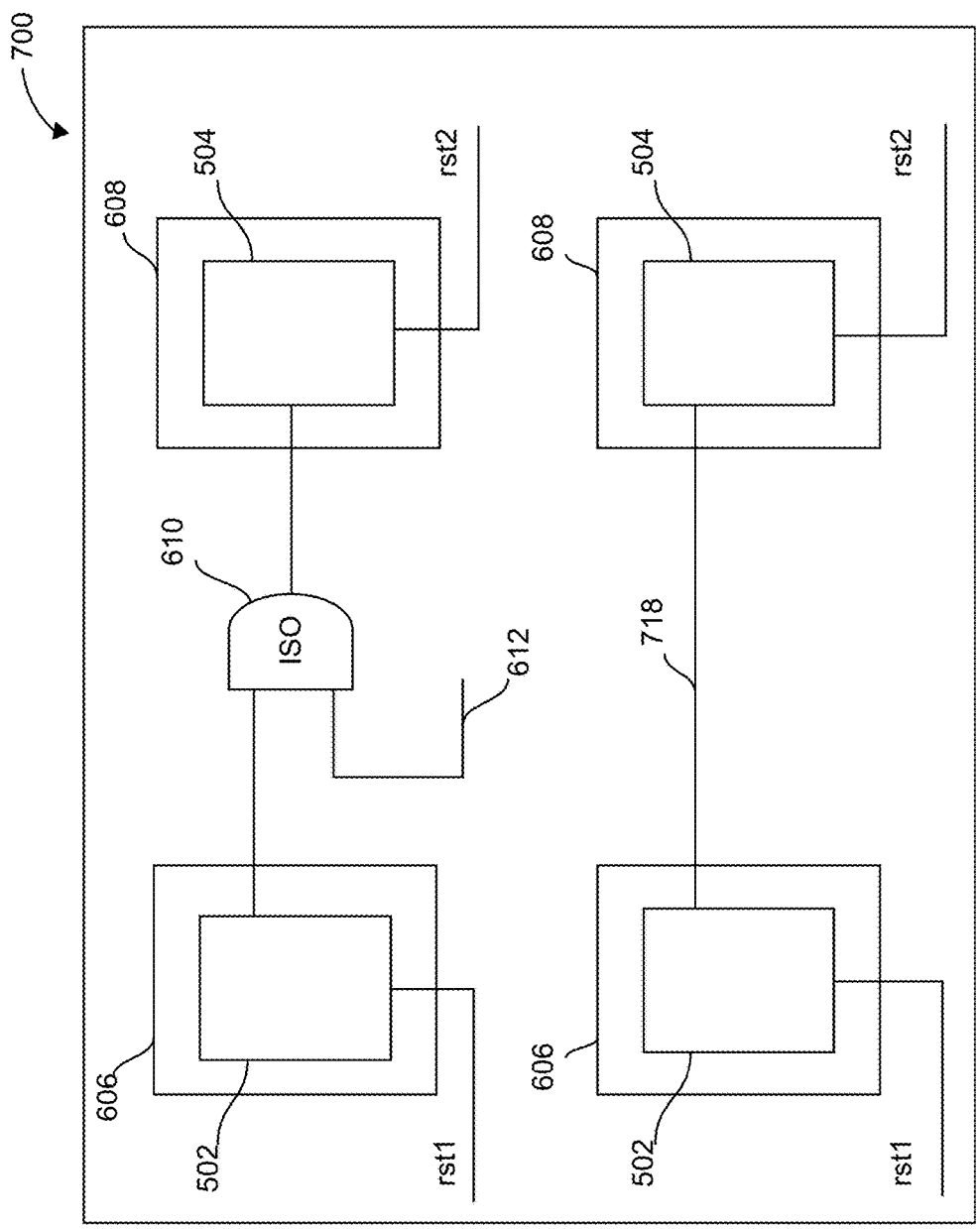
FIG. 7 illustrates circuit design modification in accordance with one embodiment.

An additional exemplary embodiment of an improved design process to form safe crossings between power domains and reset domains is illustrated in conjunction with FIG. 5, FIG. 6, and FIG. 7.

Referring to FIG. 5, an exemplary initial circuit design 500 comprising multiple reset domains may comprise source flop 502, destination flop 504, and reset domain crossing 506. As discussed previously, the identified reset domain crossing 506 may result in metastability resulting from a reset assertion on source flop 502 resulting in setup/hold time violations for destination flop 504. In one embodiment, the reset domain crossing 506 may be made safe using the reset and power domain configuration system 800 described in FIG. 8, and the circuit modification process 900 described in FIG. 9.

Referring to FIG. 6, a second exemplary circuit design 600 includes an isolation circuit in the form of a gate 610 generated between a first power domain 606 that includes the source flop 502 (with first reset domain) and a second power domain 608 that includes the destination flop 504 (with second reset domain). The gate 610 is controlled by an UPF ISO enable/control signal 612.

Figure 8:
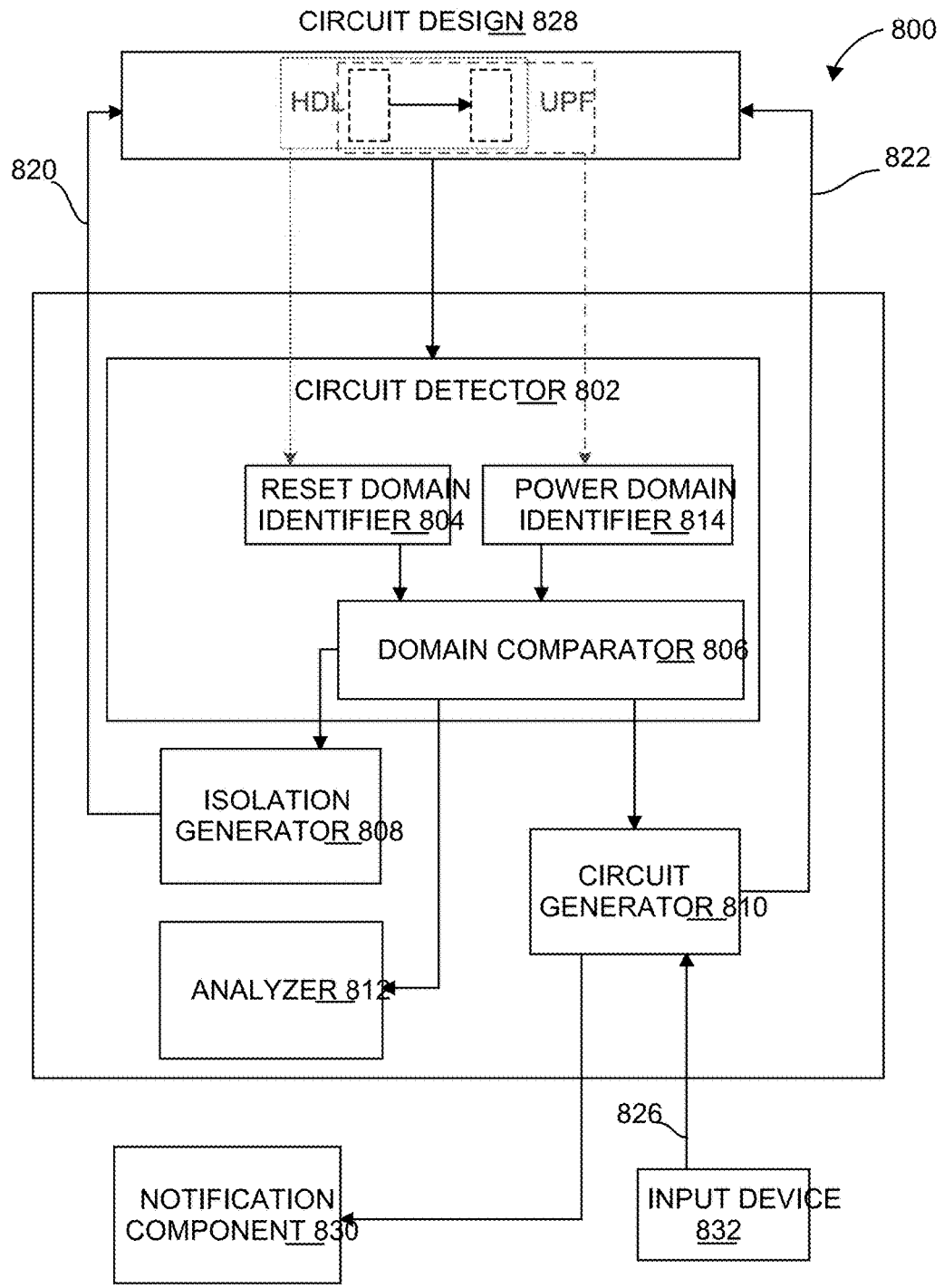
FIG. 8 illustrates an embodiment of a reset and power domain configuration system.

To identify the circuit design 600, a system such as the reset and power domain configuration system 800 of FIG. 8 may read a HDL of an RTL-level circuit design description 828 (which can be described in any HDL language) and unified power format (UPF) description of an RTL-level circuit design description 828 and identify power domain crossings that may overlap with RDCs in the circuit design. The reset and power domain configuration system 800 may infer information such as UPF isolation (ISO) strategies (e.g., gate 610) and the UPF ISO enable/control signal 612 that operates the isolation strategy, if any.

If the UPF ISO enable/control signal 612 is identified as also being a reset isolation control (qualifier) for the circuit design 600, then the reset and power domain configuration system 800 may mark (flag) such path as safe for RDC, as gate 610 will make the data crossing between the source flop 502 and the destination flop 504 safe in both reset domains as well.

If UPF ISO strategies are present in the circuit design 600 but the UPF ISO enable/control signal 612 is not also a reset isolation control signal, the reset and power domain configuration system 800 may mark the UPF ISO enable/control signal 612 as a candidate for use as a reset isolation control signal (i.e., to control shared RDC/PDC isolation gate 610).

Referring to FIG. 7, circuit design modification 700 may begin with the reset and power domain configuration system 800 identifying that UPF ISO strategies (such as gate 610) are missing in the un-gated common path 718, which has RDCs and power domain crossings in common. The reset and power domain configuration system 800 may generate the gate (cell) or UPF ISO strategies 610 on the un-gated common path 718, and may utilize the UPF ISO enable/control signal 612 as a reset isolation control signal as well. The reset and power domain configuration system 800 may generate new UPF comprising the gate 610 and UPF ISO enable/control signal 612 to address unsafe RDC crossings.

An exemplary embodiment of the new UPF that may be generated by the reset and power domain configuration system 800 for the circuit design modification 700 is (parametrically):

set isolation ISO_RDC_RST1
    domain VDDA
    source VDDA_SUPPLY
    isolation_power_net VDDB
    isolation_ground_net VSS name_suffix_ISO_RDC_RST1_GATE
clamp_value 0
elements {top/crossing_net}

In another embodiment, circuit design modification 700 may also be used for different reset combinations utilizing the same source reset. For example, two or more different destination flops may utilize a different reset signal, such as rst3. Provided that the source flops providing data to these destination flops use the same reset signal, the techniques described herein may be utilized to generate new UPF for the combination of flops.

Referring to FIG. 8, the reset and power domain configuration system (enhanced EDA software tool) 800 may comprise circuit detector 802, reset domain identifier 804, domain comparator 806, isolation generator 808, circuit generator 810, analyzer 812, circuit modification 820, circuit modification 822, input device control 826, circuit design 828, notification component 830, and input device 832. The reset and power domain configuration system 800 may be operated in accordance with FIG. 9.

The circuit detector 802 may identify components, paths, and domains in the circuit design 828. The reset domain identifier 804 may analyze, for example, an RTL description of the circuit design 828 to identify reset domains and reset domain crossings (RDCs). The power domain identifier 814 may analyze a UPF description of the circuit design 828 to identify power domains, power domain crossings and information regarding Isolation cells, strategies and UPF state tables. The domain comparator 806 may compare the RDCs determined by the reset domain identifier 804 to power domain crossings determined by the power domain identifier 814. The domain comparator 806 may determine whether power domain isolation circuits are present in the circuit design 828 that may be used to resolve any RDCs, whether additional paths or components may be added to resolve any RDCs, and whether an RDC and power domain crossing may both be resolved by a single isolation strategy.

The isolation generator 808 may send a UPF and/or circuit modification 820 to the circuit design 828 to add an isolation circuit to UPF description of the circuit design 828. This may occur when the domain comparator 806 determines that an isolation strategy is missing (e.g., for a power domain crossing), or when an existing isolation strategy for a power domain crossing should be modified to also account for one or more RDCs.

The circuit generator 810 may notify the notification component 830 when ISO strategies for power domains are present, but their control signals are not given as reset isolation signals. The notification component 830 may provide to a system user a list of power domain isolation controls that are candidates for reset isolation controls.

The circuit generator 810 may receive an input device control 826 from the input device 832, instructing the circuit generator 810 to insert a circuit modification 822, such as a component, path, or domain, to the circuit design 828.

The analyzer 812 may report results from the domain comparator 806 to a system user (e.g., a circuit designer). These results may include the status of RDCs, such as whether a domain is "safe" and Reset domain overlaps with power domain. In an embodiment, the reports may be sent to one or machines, e.g., machines capable of providing a sensory feedback to a user.

An exemplary method performed by system 800 will now be described with reference to a circuit modification process depicted by the flow diagram shown in FIG. 9, and with reference to the initial and modified exemplary circuit designs depicted in FIGS. 9A and 9B.

Figure 9:
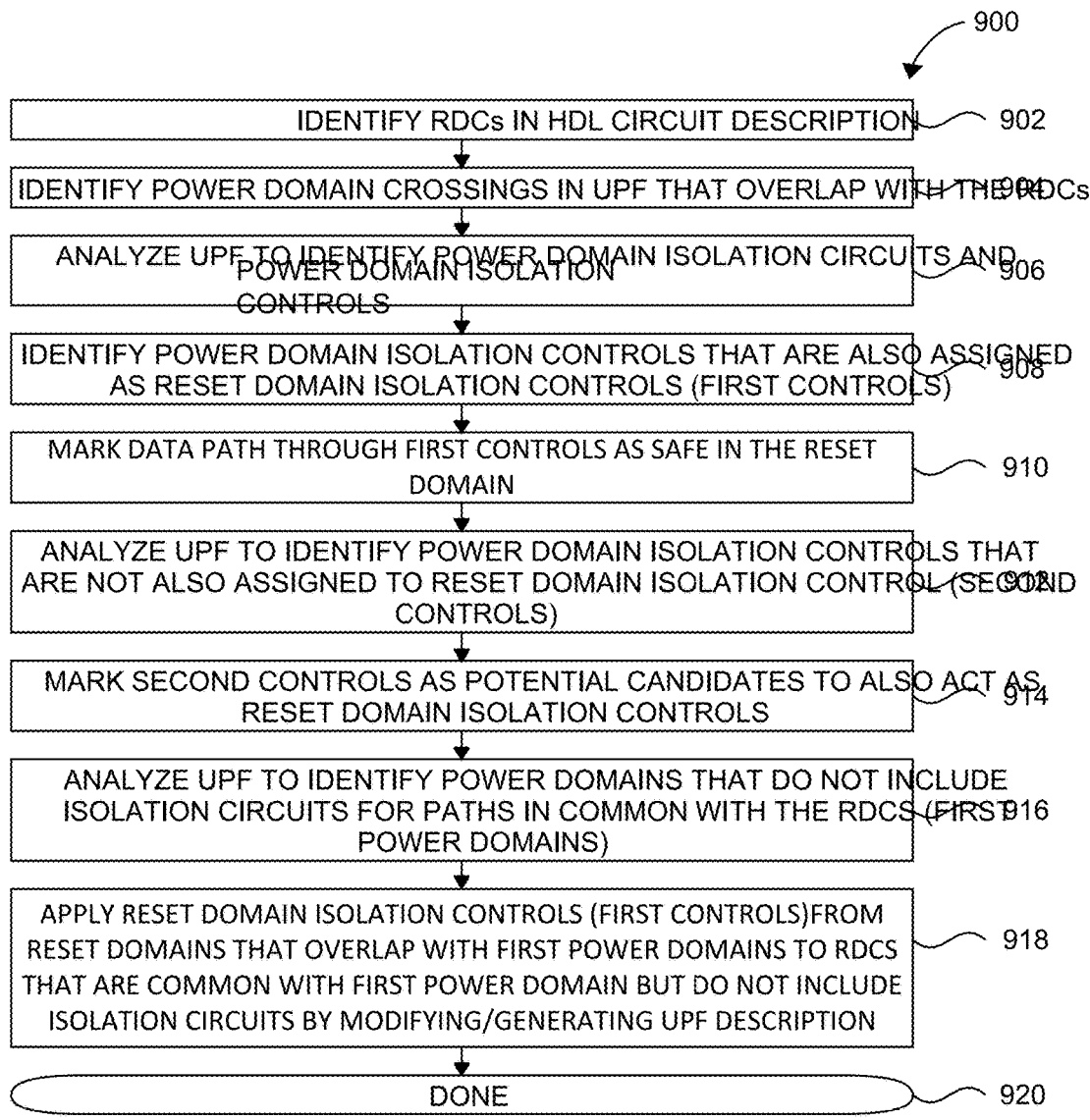
FIG. 9 illustrates an embodiment of a circuit modification process.
Figure 9A:
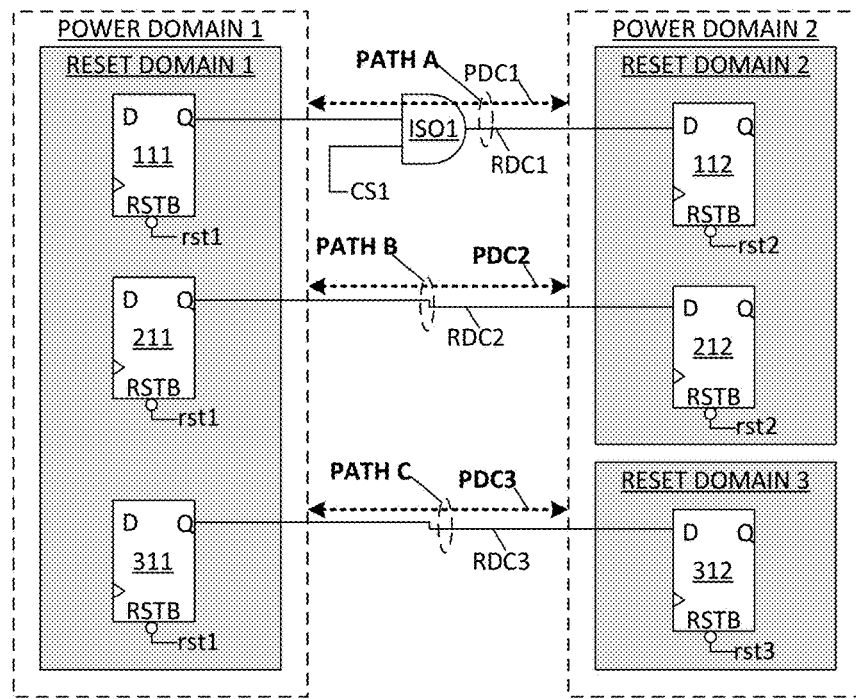
FIGS. 9A and 9B depict simplified initial and modified circuit designs, respectively, that are subject to the circuit modification process of FIG. 9.

Referring to FIG. 9, in block 902, a circuit modification process 900 identifies RDCs that are present in a circuit design. In the exemplary embodiment shown in FIG. 9A, this RDC identification process would identify the RDC1, RDC2 and RDC3, where RDC1 extends between flip-flop 111 in Reset Domain 1 and flip-flop 112 in Reset Domain 2, RDC2 extends between flip-flop 211 in Reset Domain 1 and flip-flop 212 in Reset Domain 2, and RDC3 extends between flip-flop 311 in Reset Domain 1 and flip-flop 212 in Reset Domain 3.

In block 904, the UPF description of the circuit design is analyzed to identify all power domain crossings that overlap with one or more RDCs. FIG. 9A shows power domain crossings PDC1, PDC2 and PDC3, which are signals passing between Power Domain 1 and Power Domain 2. In this case, crossings PDC1 to PDC3 coincide with RDCs RDC1 to RDC3, respectively, although power domain crossings between Power Domains 1 and 2 may exist between other (i.e., non-flip-flop) circuits. For convenience, each combined overlapping power and reset domain crossing is referred to below as a path (i.e., overlapping PDC1 and RDC1 are identified as PATH A, overlapping PDC2 and RDC2 are identified as PATH B, and overlapping PDC3 and RDC3 are identified as PATH C).

In block 906 (FIG. 9), the UPF description is analyzed to identify power domain isolation circuits and power domain isolation controls that are present in the circuit design and may be configured or utilized to accommodate the common (overlapped) power domain and reset domain crossings.

In block 908, the UPF is analyzed to identify first power domain isolation controls that are also assigned as reset domain isolation controls (i.e., each identified first power domain isolation control is configured to accommodate an associated overlapping power domain and reset domain crossing). Referring to FIG. 9A, isolation gate ISO1 and isolation control signal CS1 is identified in block 908 as a first power domain isolation control because it coincidentally serves both PDC1 and as a reset domain isolation control for overlapping RDC1. In block 910, the data paths through these first (common) controls are marked as safe (e.g., PATH A is designated as a safe reset domain crossing in the HDL descriptions in order to simplify subsequent RTL analysis).

In block 912, the UPF is analyzed to identify second power domain isolation controls that are not also assigned as a reset domain isolation control for an overlapping RDC. In FIG. 9A, this control identification process would identify control gate ISO1 and control signal CS1 as second domain isolation controls because they pass between Power Domains 1 and 2, but are not utilized as a reset domain isolation control for PATH B (i.e., overlapping PDC2 and RDC2). In block 914, these power domain isolation (second) controls are marked as potential candidates to gate or isolate reset domain crossings in reporting as well as the RTL to also act as reset domain isolation controls.

In block 916, the UPF description is analyzed to identify (first) power domain crossings that do not include isolation circuits for domain crossings in common with the RDCs. Referring to FIG. 9A, this power domain crossing process would identify both PATH B and PATH C because both include overlapping PDCs and RDCs that do not include isolation circuits.

In block 918, reset domain isolation controls from reset domains that overlap with the first power domains are utilized to generate and control power domain isolation circuits for these (first) power domains by generating new UPF description or modifying an existing UPF description.

Figure 9B:
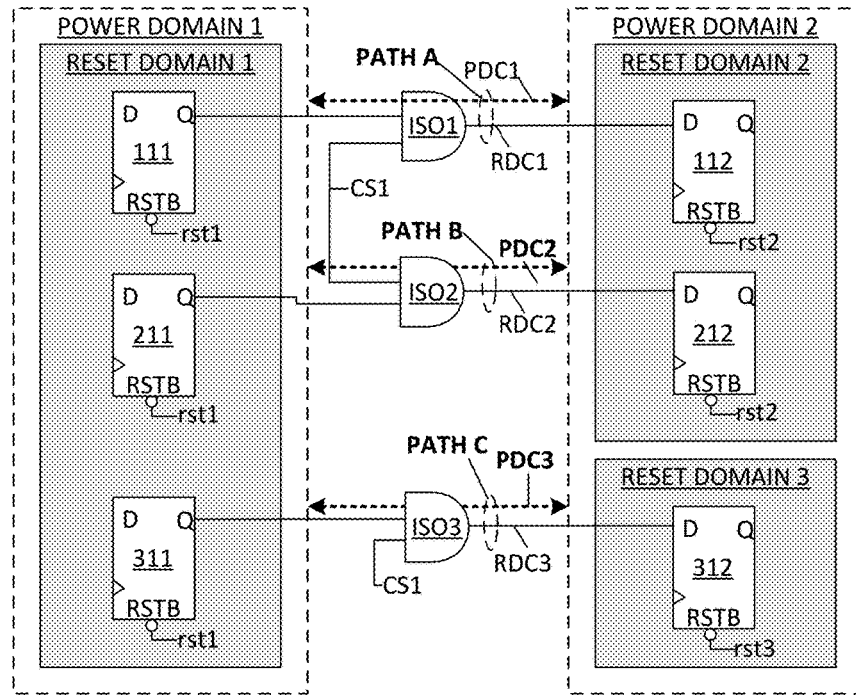

Referring to FIG. 9B, in one embodiment, the circuit description is modified such that PATH B includes a second isolation gate ISO2 that is controlled using the same control signal (signal CS1) is utilized for PATH A, thereby sharing control signal CS1 (it may also be possible to modify gate ISO1 to accommodate both paths). In addition, the circuit description is modified such that PATH C includes a third isolation circuit ISO3. In this case, because the source reset domain (i.e., Reset Domain 1) of PATH C is the same as that of PATH A, control signal CS1 may be utilized to generate a new isolation strategy that is configured to accommodate reset domain crossings from Reset Domain 1 to Reset Domain 3.

In block 920, the circuit modification process and/or UPF modification process 900 ends, and the circuit design, including modified RTL and UPF descriptions, is passed to the next phase of verification and analysis.

Circuit modification process 900 receives multiple controls from machines, generating a machine state. In response to one or more particular machine states, the circuit modification process 900 transforms those controls to machine controls, which are then applied to alter the state and operation of one or more machines. See FIG. 10 for an example of a machine that may be operated, modified and created in this fashion.

Figure 10:
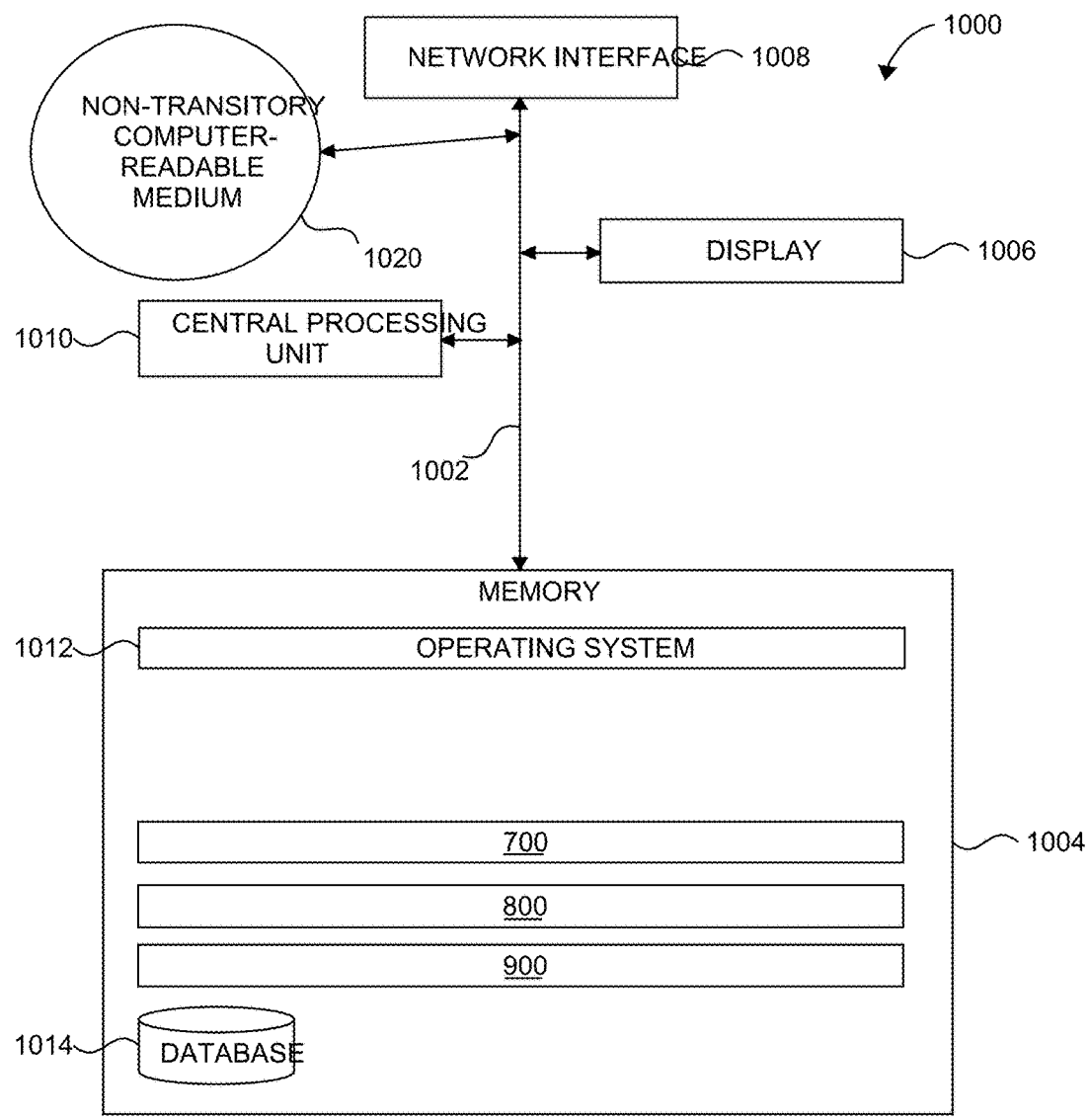
FIG. 10 illustrates a computer system in accordance with one embodiment.

FIG. 10 illustrates several components of an exemplary computer system 1000 in accordance with one embodiment. The computer system 1000 may implement the reset and power domain configuration system 800 and circuit modification process 900 embodiments described herein.

The computer system 1000 may include a desktop PC, server, workstation, mobile phone, laptop, tablet, set-top box, appliance, or other computing device that is capable of performing operations such as those described herein. In some embodiments, computer system 1000 may include many more components than those shown in FIG. 10. However, it is not necessary that all of these generally conventional components be shown in order to disclose an illustrative embodiment. Collectively, the various tangible components or a subset of the tangible components may be referred to herein as "logic" configured or adapted in a particular way, for example as logic configured or adapted with particular software or firmware.

In various embodiments, computer system 1000 may comprise one or more physical and/or logical devices that collectively provide the functionalities described herein. In some embodiments, computer system 1000 may comprise one or more replicated and/or distributed physical or logical devices.

In some embodiments, computer system 1000 may comprise one or more computing resources provisioned from a "cloud computing" provider, for example, Amazon Elastic Compute Cloud ("Amazon EC2"), provided by Amazon.com, Inc. of Seattle, Wash.; Sun Cloud Compute Utility, provided by Sun Microsystems, Inc. of Santa Clara, Calif.; Windows Azure, provided by Microsoft Corporation of Redmond, Wash., and the like.

Computer system 1000 includes a bus 1002 interconnecting several components including a network interface 1008, a display 1006, a central processing unit 1010, and a memory 1004.

Memory 1004 generally comprises a random access memory ("RAM") and permanent non-transitory mass storage device, such as a hard disk drive or solid-state drive. Memory 1004 stores an operating system 1012.

These and other software components may be loaded into memory 1004 of computer system 1000 using a drive mechanism (not shown) associated with a non-transitory computer-readable medium 1020, such as a floppy disc, tape, DVD/CD-ROM drive, memory card, or the like.

Memory 1004 also includes database 1014. In some embodiments, computer system 1000 may communicate with database 1014 via network interface 1008, a storage area network ("SAN"), a high-speed serial bus, and/or via the other suitable communication technology.

In some embodiments, database 1014 may comprise one or more storage resources provisioned from a "cloud storage" provider, for example, Amazon Simple Storage Service ("Amazon S3"), provided by Amazon.com, Inc. of Seattle, Wash., Google Cloud Storage, provided by Google, Inc. of Mountain View, Calif., and the like.

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other. "Logic" refers to machine memory circuits, non transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter). Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein. The techniques and procedures described herein may be implemented via logic distributed in one or more computing devices. The particular distribution and choice of logic will vary according to implementation. Those having skill in the art will appreciate that there are various logic implementations by which processes and/or systems described herein can be effected (e.g., hardware, software, and/or firmware), and that the preferred vehicle will vary with the context in which the processes are deployed. "Software" refers to logic that may be readily readapted to different purposes (e.g. read/write volatile or nonvolatile memory or media). "Firmware" refers to logic embodied as read-only memories and/or media. Hardware refers to logic embodied as analog and/or digital circuits. If an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware. The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, flash drives, SD cards, solid state fixed or removable storage, and computer memory. In a general sense, those skilled in the art will recognize that the various aspects described herein which can be implemented, individually and/or collectively, by a wide range of hardware, software, firmware, or any combination thereof can be viewed as being composed of various types of "circuitry." Consequently, as used herein "circuitry" includes, but is not limited to, electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), circuitry forming a memory device (e.g., forms of random access memory), and/or circuitry forming a communications device (e.g., a modem, communications switch, or optical-electrical equipment). Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

Figure 11:
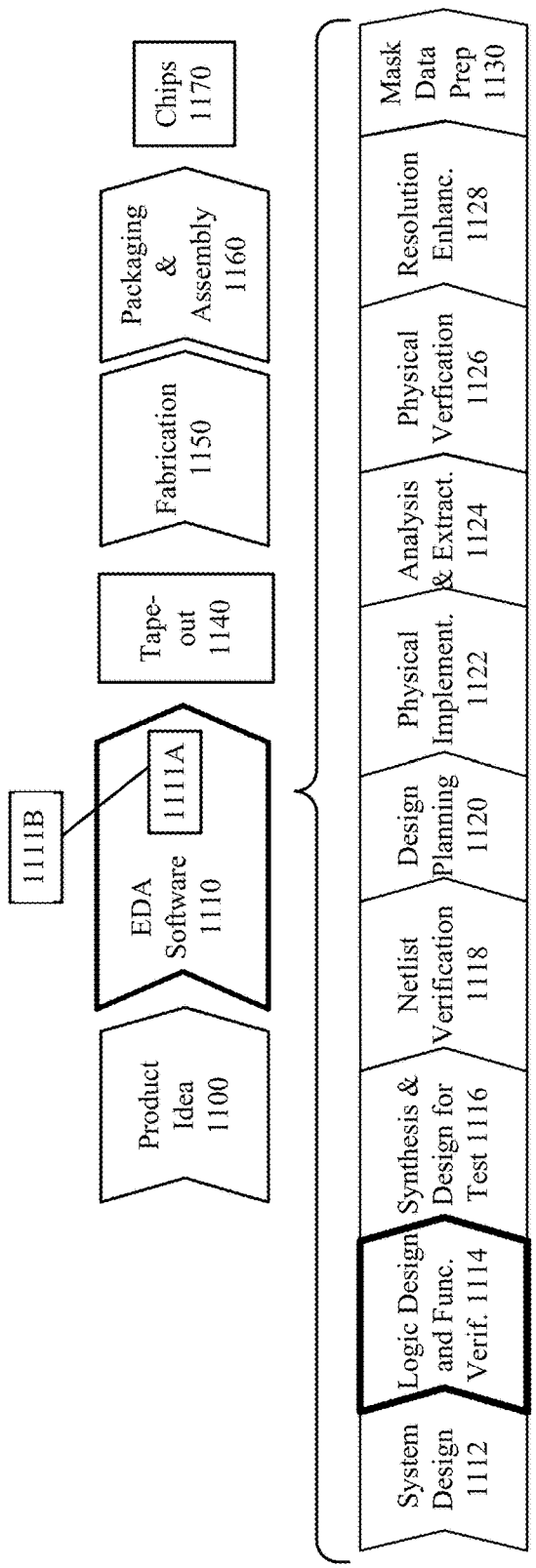
FIG. 11 illustrates a simplified IC production flow including the circuit design modification technique of the present invention.

FIG. 11 shows a simplified representation of an exemplary IC design flow including the UPC aware RDC analysis approach described above. At a high level, the process starts with the product idea (step 1100) and is realized in an Electronic Design Automation (EDA) software design process (step 1110). When the design is finalized, it can be taped-out (event 1140). After tape out, the fabrication process (step 1150) and packaging and assembly processes (step 1160) occur resulting, ultimately, in packaged integrated circuit chips (result 1170).

The EDA software design process (step 1110) is actually composed of a number of steps 1112-1130, shown in linear fashion for simplicity. In an actual IC design process, the particular design might have to go back through steps until certain tests are passed. Similarly, in any actual design process, these steps may occur in different orders and combinations. This description is therefore provided by way of context and general explanation rather than as a specific, or recommended, design flow for a particular IC.

A brief description of the components/steps of the EDA software design process (step 1110) will now be provided. In one embodiment, one or more steps of the EDA software design process can be implemented using a computer-readable medium 1111A, which is read by a computer 1111B. Note that Astro, AstroRail, CustomSim, ESP, Hercules, IC Compiler, Magellan, Model Architect, Power Compiler, PrimeRail, Proteus, ProteusAF, PSMGen, Saber, SpyGlass, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc.

System design (step 1112): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect™ Saber™, System Studio™, and DesignWare® products.

Logic design and functional verification (step 1114): At this stage, the HDL (e.g., VHDL or Verilog) and UPF descriptions of the circuit design are written, and the circuit design is checked for functional and structural accuracy. More specifically, the circuit design is checked to ensure that it produces the correct outputs. Exemplary EDA software products from Synopsys, Inc. that can be used at this step include HSIM®, NanoSim®, CustomSim™ SpyGlass®, VC®, VCS®, VERA®, DesignWare®, Magellan™, Formality®, ESP™ and LEDA® products. In one embodiment, the UPC aware RDC analysis approach of the present invention is performed during logic design and functional verification.

Synthesis and design for test (step 1116): Here, the VHDL/Verilog circuit description is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, and DesignWare® products.

Netlist verification (step 1118): At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 1120): Here, an overall floorplan for the chip is constructed and analyzed for timing and top-level routing. Exemplary EDA software products from Synopsys, Inc. that can be used at this step include Astro™ and IC Compiler™ products.

Physical implementation (step 1122): The placement (positioning of circuit elements) and routing (connection of the same) occurs at this step. Exemplary EDA software products from Synopsys, Inc. that can be used at this step include the Astro™ and IC Compiler™ products.

Analysis and extraction (step 1124): At this step, the circuit function is verified at a transistor level, this in turn permits what-if refinement. Exemplary EDA software products from Synopsys, Inc. that can be used at this step include AstroRail™, PrimeRail™ Primetime®, and Star RC/XT™ products.

Physical verification (step 1126): At this step various checking functions are performed to ensure correctness for: manufacturing, electrical issues, lithographic issues, and circuitry. Exemplary EDA software products from Synopsys, Inc. that can be used at this step include the Hercules™ product. In one embodiment, the process hotspot detection technique using critical design rule extraction can be used in step 1126.

Resolution enhancement (step 1128): This step involves geometric manipulations of the layout to improve manufacturability of the design. Exemplary EDA software products from Synopsys, Inc. that can be used at this step include Proteus™, ProteusAF™, and PSMGen™ products. In one embodiment, the process hotspot detection technique using critical design rule extraction can be used in step 1128.

Mask data preparation (step 1130): This step provides the "tape-out" data for production of masks for lithographic use to produce finished chips. Exemplary EDA software products from Synopsys, Inc. that can be used at this step include the CATS® family of products.

Figure 12:
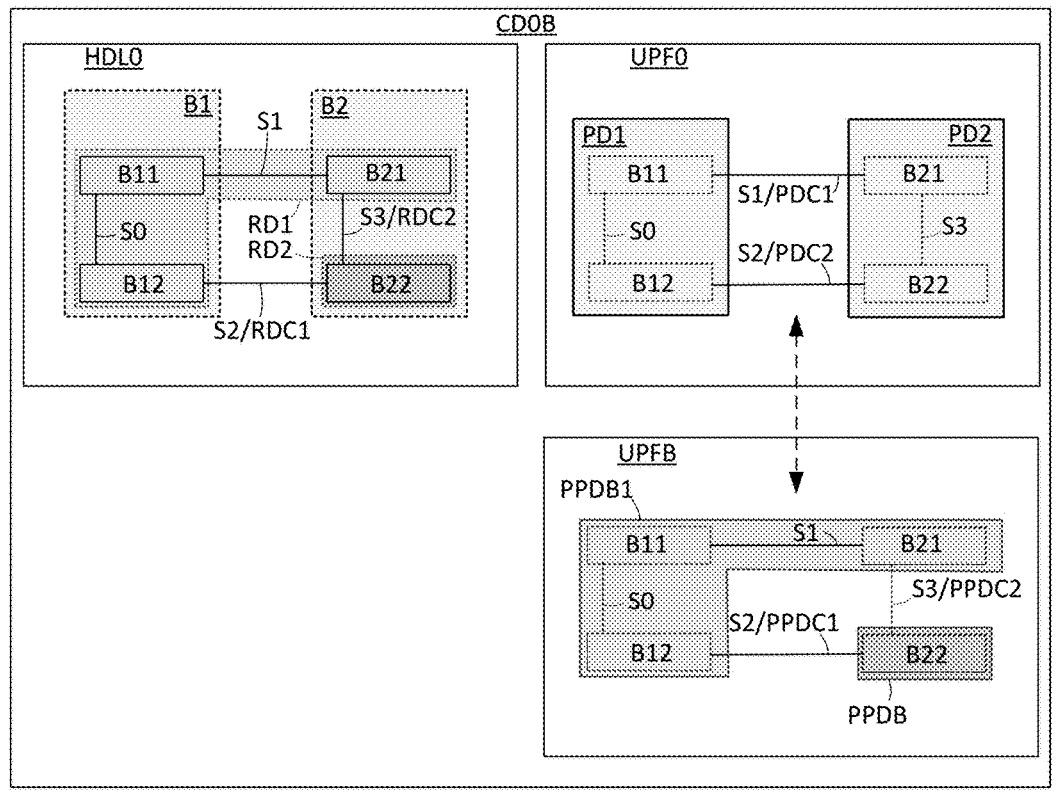
FIG. 12 is a diagram depicting an exemplary simplified circuit design utilizing a separate modified UPF description according to an alternative embodiment of the present invention.
Figure 13:
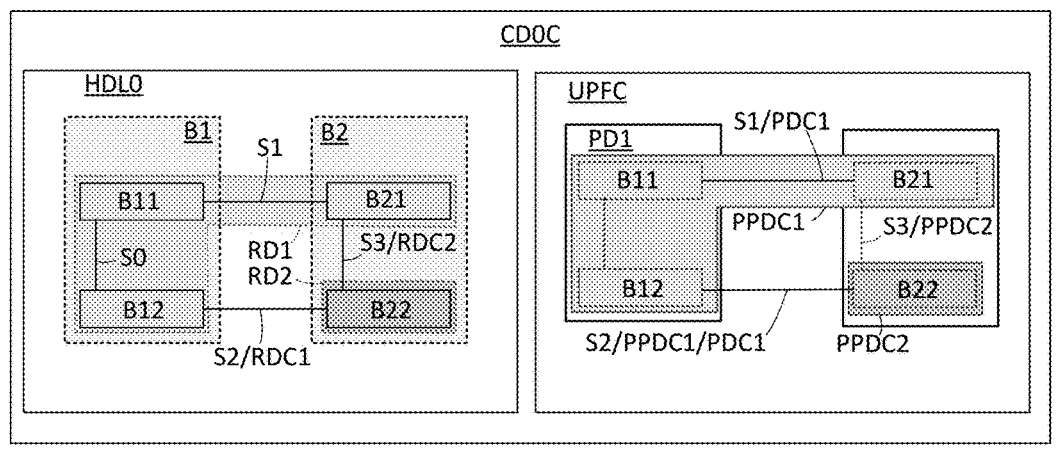
FIG. 13 is a diagram depicting an exemplary simplified circuit design utilizing a combined modified UPF description according to another alternative embodiment of the present invention.

Although illustrative embodiments of the invention have been described in detail herein with reference to the accompanying figures, it is to be understood that the invention is not limited to those precise embodiments. For example, FIGS. 12 and 13 respectively depict exemplary modified circuit designs CD0B and CD0C that illustrate how the core concept of the present invention (i.e., utilizing UPF tools to manage RDC issues) may be extended to automatically generate RDC isolation resources. Each modified circuit design CD0B and CD0C includes initial HDL description HDL0, and modified circuit design CD0B includes initial UPF description UPF0, where initial HDL description HDL0 and initial UPF description UPF0 are described above with reference to FIG. 3. Modified circuit design CD0B and CD0C differ from circuit design CD0 (FIG. 3) in that they respectively include modified UPF descriptions UPFB and UPFC in which reset domains RD1 and RD2 identified in initial HDL description HDL0 are modeled as pseudo-power domains (i.e., reset domains RD1 and RD2 are respectively modeled as pseudo-power domains PPDB1 and PPDB2 in modified UPF descriptions UPFB, and as pseudo-power domains PPDC1 and PPDC2 in modified UPF descriptions UPFC). By designating the reset domains as pseudo-power domains, the UPF tool processes the modified UPF descriptions to automatically identify all RDCs as pseudo-power domain crossings (PPDCs). For example, in FIG. 12, the UPF tool processes modified UPF description UPFB to automatically identify RDCs RDC1 and RDC2 (shown in initial HDL description HDL0) as pseudo-power domain crossings PPDC1 and PPDC2. Note that various techniques may be utilized to implement the modified UPF descriptions. For example, circuit design CD0B (FIG. 12) implements modified UPF description UPFB as a second UPF description that models only the reset domains (i.e., separate from initial UPF description UPF0, which models power domains PD1 and PD2), whereby a modified EDA tool (or more specifically a modified UPF tool) may identify signals (e.g., signal S2) that forms both a corresponding RDC in HDL0 and a corresponding PDC by way of comparing modified UPF description UPFB and initial UPF description UPF0 (as indicated by the dashed-line arrow in FIG. 12). Alternatively, modified UPF description UPFC of circuit design CD0C (FIG. 13) combines both power domains PD1 and PD2 and pseudo-power domains PPDC1 and PPDC2, whereby a modified EDA tool may identify signals (e.g., signal S2) that forms both a corresponding RDC in HDL0 and a corresponding PDC by processing modified UPF description UPFC. Utilizing the modified UPF description techniques depicted in FIGS. 12 and 13 to model reset domains of a circuit design facilitates the automated generation of RDC isolation solutions (e.g., isolation gates and associated control circuitry) using techniques similar to those currently utilized to automatically generate PDC isolation solutions. The inventors note that the approaches illustrated in FIGS. 12 and 13 may be utilized either to address unresolved RDC issues in a partially completed circuit design (i.e., where previously established RDC and PDC resources are maintained), or may be utilized to generate a new circuit design (i.e., by disregarding all previously established RDC and PDC resources) in order to maximize circuit efficiency. Moreover, those skilled in the art will recognize that the depictions shown in FIGS. 12 and 13 are merely exemplary, and that other approaches may be utilized to generate modified UPF descriptions that implement the spirit of the present invention. Thus, the scope of the invention is defined by the following claims and their equivalents.

What is claimed is:

1. A method of efficiently addressing reset domain crossings (RDCs) and power domain crossings (PDCs) in an initial circuit design, said initial circuit design including a plurality of circuit structures and a plurality of signals passing between said plurality of circuit structures, said initial circuit design being defined by an initial Hardware Description Language (HDL) description in which each of said plurality of circuit structures is assigned to an associated reset domain of a plurality of reset domains such that one or more of said plurality of signals forms a corresponding said RDC between two reset domains of said plurality of reset domains, said initial circuit design being further defined by an initial Unified Power Format (UPF) description in which each of said plurality of circuit structures is further assigned to an associated power domain of a plurality of power domains such that one or more of said plurality of signals forms a corresponding said PDC between two power domains of said plurality of power domains, the method comprising:

utilizing both said initial HDL description and said initial UPF description to identify at least one signal of said plurality of signals that forms both a corresponding said RDC and a corresponding said PDC;

generating a report indicating that said at least one signal is a candidate for a shared RDC/PDC isolation structure.

2. The method of claim 1, wherein utilizing both said initial HDL description and said initial UPF description comprises:

selecting a signal of said plurality of signals that forms a corresponding RDC in said initial HDL description;

analyzing said initial UPF description to determine whether said selected signal also forms a corresponding PDC.

3. The method of claim 2, wherein utilizing both said initial HDL description and said initial UPF description further comprises determining whether said corresponding PDC includes an associated isolation resource.

4. The method of claim 3, wherein determining whether said corresponding PDC includes an associated isolation resource further comprises determining whether said associated isolation resource is compatible with said corresponding RDC.

5. The method of claim 2, further comprising determining whether said selected signal is associated with one of isolation resources and synchronization resources in said initial HDL description.

6. The method of claim 5, wherein said determining is performed before said analyzing said initial UPF description.

7. The method of claim 1, wherein utilizing both said initial HDL description and said initial UPF description comprises utilizing the initial HDL description to generate a modified UPF description in which reset domains identified in the initial HDL description are modeled as pseudo-power domains in the modified UPF description, and said signals forming said RDCs in said initial HDL description are identified as pseudo-power domain crossings in the modified UPF description.

8. The method of claim 7, wherein utilizing the initial HDL description to generate said modified UPF description comprises generating said modified UPF description separate from said initial UPF description.

9. The method of claim 7, wherein utilizing the initial HDL description to generate said modified UPF description comprises generating said modified UPF description including both said plurality of power domains of said initial UPF description and said pseudo-power domains.

10. The method of claim 7, further comprising utilizing said modified UPF description to automatically generate RDC isolation solutions.

11. A method for verifying a circuit design utilized to fabricate an integrated circuit (IC), the circuit design including a plurality of reset domains and power domains, the method comprising utilizing a Unified Power Format (UPF) description of the circuit design and a Hardware Description Language (HDL) description of the circuit design to identify at least one signal that forms a reset domain crossing (RDC) by way of being transmitted between two reset domains of said plurality of reset domains, and also forms a power domain crossing (PDC) by way of being transmitted between two power domains of said plurality of power domains.

12. The method of claim 11, further comprising generating a report indicating that said at least one signal is a candidate for a shared RDC/PDC isolation structure.

13. The method of claim 11, further comprising automatically generating a shared RDC/PDC isolation structure for said at least one signal.

14. The method of claim 11, wherein utilizing said UPF description comprises:

selecting a signal of said plurality of signals that forms a corresponding RDC in an initial HDL description of said circuit design; and analyzing said UPF description to determine whether said selected signal also forms a corresponding said PDC.

15. The method of claim 14, wherein utilizing said UPF description further comprises determining whether said corresponding PDC includes an associated isolation resource.

16. The method of claim 15, wherein determining whether said corresponding PDC includes an associated isolation resource further comprises determining whether said associated isolation resource is compatible with said corresponding RDC.

17. The method of claim 11, wherein utilizing said UPF description comprises utilizing an HDL description of said circuit design to generate a modified UPF description in which reset domains identified in the HDL description are modeled as pseudo-power domains in the modified UPF description, and said at least one signal forming said corresponding RDC in said HDL description is identified as a pseudo-power domain crossing in the modified UPF description.

18. The method of claim 17, wherein utilizing the HDL description to generate said modified UPF description comprises generating said modified UPF description separate from said initial UPF description.

19. The method of claim 17, wherein utilizing the HDL description to generate said modified UPF description comprises generating said modified UPF description including both said plurality of power domains and said pseudo-power domains.

20. A non-transitory, computer-readable medium storing an EDA software tool including computer-executable instructions configured such that, when the EDA software tool is executed by a processor, cause the processor to execute a process comprising a method for verifying a circuit design utilized to fabricate an integrated circuit (IC), the circuit design including a plurality of reset domains and power domains, said verifying method including analyzing a Unified Power Format (UPF) description of the circuit design and a Hardware Description Language (HDL) description of the circuit design to identify at least one signal of the circuit design that forms a reset domain crossing (RDC) by way of being transmitted between two reset domains of said plurality of reset domains, and also forms a power domain crossing (PDC) by way of being transmitted between two power domains of said plurality of power domains.

* * * * *